(12) United States Patent
Kim et al.

(10) Patent No.: US 12,341,108 B2
(45) Date of Patent: Jun. 24, 2025

(54) SHIELDED SEMICONDUCTOR PACKAGE WITH OPEN TERMINAL AND METHODS OF MAKING

(71) Applicant: STATS ChipPAC Pte. Ltd., Singapore (SG)

(72) Inventors: ChangOh Kim, Incheon (KR); KyoWang Koo, Incheon (KR); SungWon Cho, Seoul (KR); BongWoo Choi, Seoul (KR); JiWon Lee, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 49 days.

(21) Appl. No.: 18/455,419

(22) Filed: Aug. 24, 2023

(65) Prior Publication Data

US 2023/0402401 A1    Dec. 14, 2023

Related U.S. Application Data

(60) Continuation of application No. 17/136,197, filed on Dec. 29, 2020, now Pat. No. 11,784,133, which is a division of application No. 16/220,934, filed on Dec. 14, 2018, now Pat. No. 10,910,322.

(51) Int. Cl.
| | | |
|---|---|---|
| *H01L 23/552* | (2006.01) | |
| *H01L 21/311* | (2006.01) | |
| *H01L 21/56* | (2006.01) | |
| *H01L 23/00* | (2006.01) | |
| *H01L 23/31* | (2006.01) | |
| *H01L 23/66* | (2006.01) | |

(52) U.S. Cl.
CPC ...... *H01L 23/552* (2013.01); *H01L 21/31144* (2013.01); *H01L 21/563* (2013.01); *H01L 21/565* (2013.01); *H01L 23/3128* (2013.01); *H01L 23/66* (2013.01); *H01L 24/09* (2013.01); *H01L 24/17* (2013.01)

(58) Field of Classification Search
CPC . H01L 23/552; H01L 21/31144; H01L 21/563
See application file for complete search history.

(56) References Cited

U.S. PATENT DOCUMENTS

| | | |
|---|---|---|
| 6,744,126 B1 | 6/2004 | Chiang |
| 7,752,751 B2 | 7/2010 | Kapusta et al. |
| 7,772,046 B2 * | 8/2010 | Pagaila ................. H01L 25/165 |
| | | 257/E21.502 |

(Continued)

FOREIGN PATENT DOCUMENTS

| | | | |
|---|---|---|---|
| CN | 101584055 A | 11/2009 | |
| CN | 111383925 A * | 7/2020 | ......... H01L 21/4814 |

(Continued)

*Primary Examiner* — Laura M Menz
(74) *Attorney, Agent, or Firm* — Brian M. Kaufman; Robert D. Atkins; Atkins and Associates, P.C.

(57) ABSTRACT

A semiconductor device has a substrate. An electrical component is disposed over a surface of the substrate. An encapsulant is deposited over the electrical component and substrate. A portion of the surface of the substrate remains exposed from the encapsulant. A shielding layer is formed over the encapsulant. A portion of the shielding layer is removed to expose the portion of the surface of the substrate.

13 Claims, 17 Drawing Sheets

(56) References Cited

U.S. PATENT DOCUMENTS

| | | | | |
|---|---|---|---|---|
| 7,799,602 | B2* | 9/2010 | Pagaila | H01L 23/552 257/E21.007 |
| 7,851,893 | B2* | 12/2010 | Kim | H01L 23/552 257/659 |
| 7,968,979 | B2 | 6/2011 | Pagaila et al. | |
| 8,097,489 | B2* | 1/2012 | Pagaila | H01L 23/3128 438/106 |
| 8,110,441 | B2* | 2/2012 | Chandra | H01L 25/0657 257/659 |
| 8,268,677 | B1* | 9/2012 | Pagaila | H01L 21/486 257/E21.502 |
| 8,598,690 | B2* | 12/2013 | Chandra | H01L 21/561 174/394 |
| 8,810,011 | B2* | 8/2014 | Pagaila | H01L 23/3121 257/787 |
| 9,332,646 | B2* | 5/2016 | Chen | H01L 25/16 |
| 9,685,403 | B2* | 6/2017 | Pagaila | H01L 23/49838 |
| 9,768,155 | B2* | 9/2017 | Lin | H01L 25/105 |
| 10,910,322 | B2* | 2/2021 | Kim | H01L 24/17 |
| 10,937,741 | B2* | 3/2021 | Yang | H01L 21/568 |
| 10,985,109 | B2* | 4/2021 | Kim | H01L 23/3121 |
| 11,088,082 | B2* | 8/2021 | Kim | H01L 23/66 |
| 11,393,698 | B2* | 7/2022 | Kim | H01L 23/49822 |
| 11,616,025 | B2* | 3/2023 | Kim | H01L 21/0334 257/659 |
| 11,664,327 | B2* | 5/2023 | Lee | H01L 21/56 257/659 |
| 11,784,133 | B2* | 10/2023 | Kim | H01L 24/17 257/659 |
| 11,862,478 | B2* | 1/2024 | Kim | H01L 23/49822 |
| 11,887,863 | B2* | 1/2024 | Lee | H01L 23/552 |
| 11,990,424 | B2* | 5/2024 | Lee | H01L 21/6835 |
| 2009/0302437 | A1* | 12/2009 | Kim | H01L 21/561 257/E23.18 |
| 2009/0302439 | A1* | 12/2009 | Pagaila | H01L 23/29 257/E23.18 |
| 2010/0072582 | A1* | 3/2010 | Chandra | H01L 24/97 438/114 |
| 2010/0140759 | A1* | 6/2010 | Pagaila | H01L 24/73 257/E23.116 |
| 2010/0171144 | A1 | 7/2010 | Kong et al. | |
| 2010/0237477 | A1* | 9/2010 | Pagaila | H01L 25/105 257/E23.114 |
| 2012/0119348 | A1* | 5/2012 | Chandra | H01L 23/3121 257/E25.003 |
| 2012/0228749 | A1* | 9/2012 | Pagaila | H01L 21/56 257/659 |
| 2012/0248585 | A1 | 10/2012 | Wu | |
| 2012/0320558 | A1 | 12/2012 | Foster et al. | |
| 2013/0037923 | A1 | 2/2013 | Yoo | |
| 2013/0043568 | A1 | 2/2013 | Song | |
| 2014/0126161 | A1 | 5/2014 | Chen et al. | |
| 2014/0319661 | A1* | 10/2014 | Pagaila | H01L 23/3121 438/618 |
| 2015/0287708 | A1* | 10/2015 | Lin | H01L 23/5389 438/109 |
| 2017/0301986 | A1 | 10/2017 | Nguyen et al. | |
| 2018/0090449 | A1* | 3/2018 | Jeong | H01L 23/552 |
| 2018/0158768 | A1* | 6/2018 | Kim | H01L 23/49811 |
| 2018/0261551 | A1* | 9/2018 | Lee | H01L 23/16 |
| 2018/0261569 | A1* | 9/2018 | Yang | H01L 25/0652 |
| 2018/0269181 | A1* | 9/2018 | Yang | H01L 25/0655 |
| 2020/0075502 | A1* | 3/2020 | Kim | H01Q 1/2283 |
| 2020/0194379 | A1* | 6/2020 | Kim | H01L 23/66 |
| 2020/0211977 | A1* | 7/2020 | Kim | H01R 43/26 |
| 2021/0118810 | A1* | 4/2021 | Kim | H01L 24/09 |
| 2021/0210437 | A1* | 7/2021 | Kim | H01L 25/105 |
| 2022/0157739 | A1* | 5/2022 | Lee | H01L 21/561 |
| 2022/0199423 | A1* | 6/2022 | Kim | H01L 23/49838 |
| 2022/0199545 | A1* | 6/2022 | Kim | H01L 21/0334 |
| 2022/0246541 | A1* | 8/2022 | Cho | H01L 23/36 |
| 2022/0310408 | A1* | 9/2022 | Kim | H01L 23/544 |
| 2023/0074430 | A1* | 3/2023 | Lee | H01L 23/49811 |
| 2023/0170245 | A1* | 6/2023 | Kim | H01L 23/66 257/659 |
| 2023/0402401 | A1* | 12/2023 | Kim | H01L 21/565 |
| 2024/0153783 | A1* | 5/2024 | Lee | H01L 21/561 |
| 2024/0347477 | A1* | 10/2024 | Kim | H01L 21/56 |

FOREIGN PATENT DOCUMENTS

| | | | | |
|---|---|---|---|---|
| CN | 114649306 A | * | 6/2022 | G06K 19/06037 |
| DE | 102013103572 A1 | * | 2/2014 | H01L 23/552 |
| KR | 20130019249 | | 2/2013 | |
| KR | 20130025594 | | 3/2013 | |
| KR | 20180032985 A | | 4/2018 | |

* cited by examiner

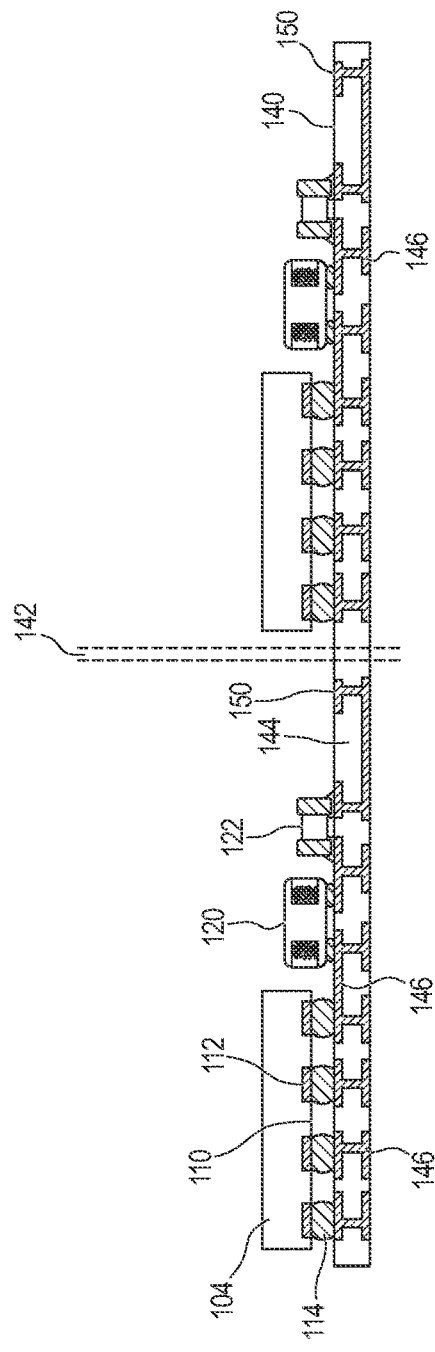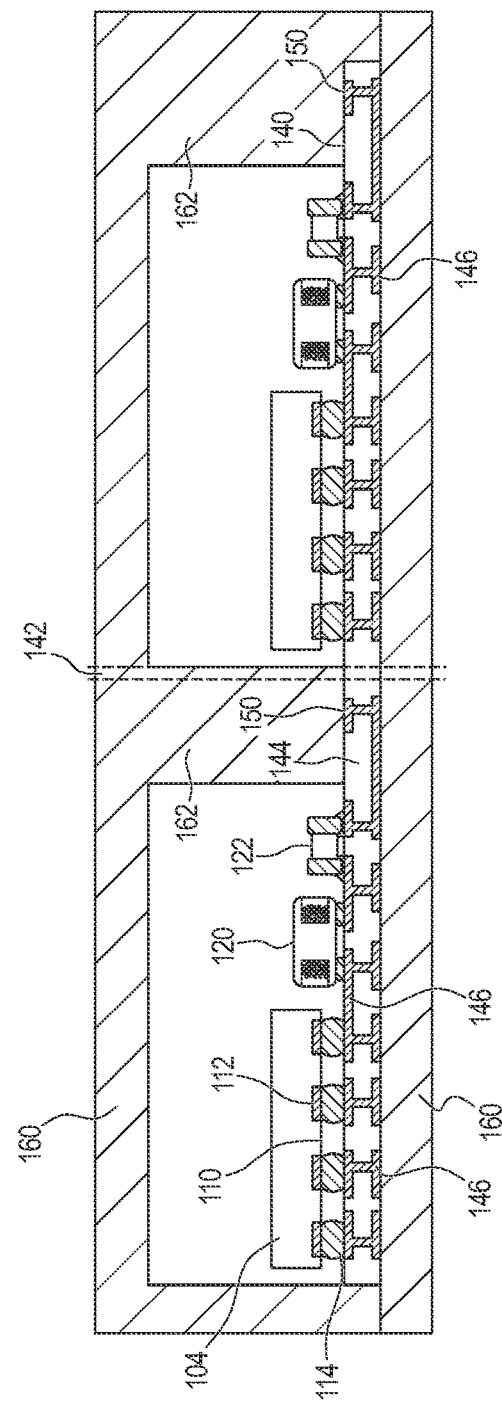

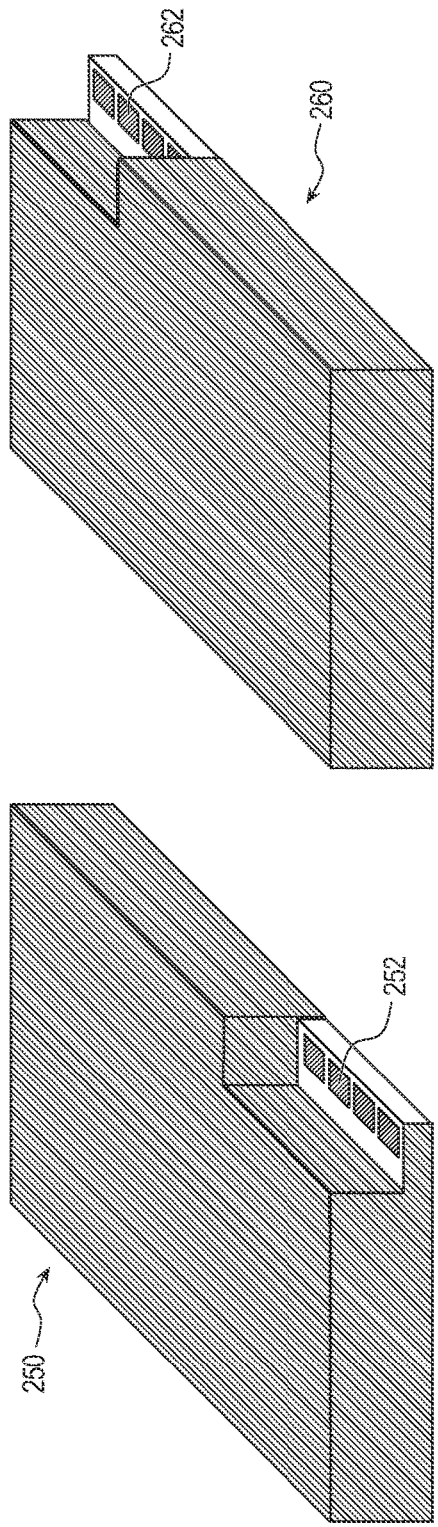
FIG. 6a
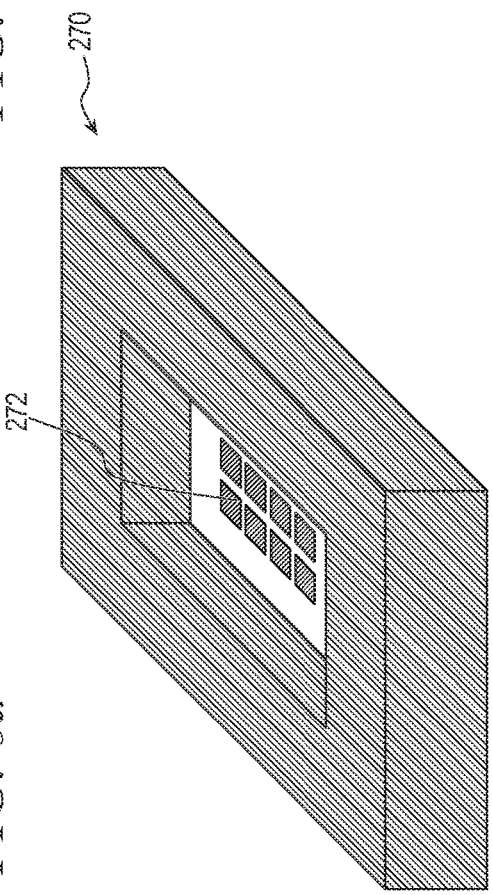
FIG. 6b
FIG. 6c

SHIELDED SEMICONDUCTOR PACKAGE WITH OPEN TERMINAL AND METHODS OF MAKING

CLAIM TO DOMESTIC PRIORITY

The present application is a continuation of U.S. patent application Ser. No. 17/136,197, now U.S. Patent No. 11,784,133, filed Dec. 29, 2020, which is a division of U.S. patent application Ser. No. 16/220,934, now U.S. Pat. No. 10,910,322, filed Dec. 14, 2018, which applications are incorporated herein by reference.

FIELD OF THE INVENTION

The present invention relates in general to semiconductor devices and, more particularly, to semiconductor packages with electromagnetic interference (EMI) shielding and one or more open terminals or sockets for connecting to adjacent devices.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generates interference.

Conductive layers are commonly formed over semiconductor packages to shield electronic parts within the package from EMI and other interference. Shielding layers absorb EMI before the signals can hit semiconductor die and discrete components within the package, which might otherwise cause malfunction of the device. Shielding layers are also formed over packages that are expected to generate EMI to protect nearby devices from malfunction.

One problem with prior methods of semiconductor package shielding is that forming the shielding layer over a package completely covers the top of the package. Unfortunately, many semiconductor packages need open areas with exposed sockets or terminals that allow connection to adjacent semiconductor devices. Traditional shielding completely covers the packages and would short circuit any exposed terminals or sockets together. Therefore, a need exists for semiconductor devices with both EMI shielding and also exposed terminals or sockets.

BRIEF DESCRIPTION OF THE DRAWINGS

FIGS. 1a-1d illustrate forming a semiconductor package with exposed terminals;

FIGS. 6a-6c illustrate alternative configurations for the exposed terminals.

DETAILED DESCRIPTION OF THE DRAWINGS

Figure 1C:
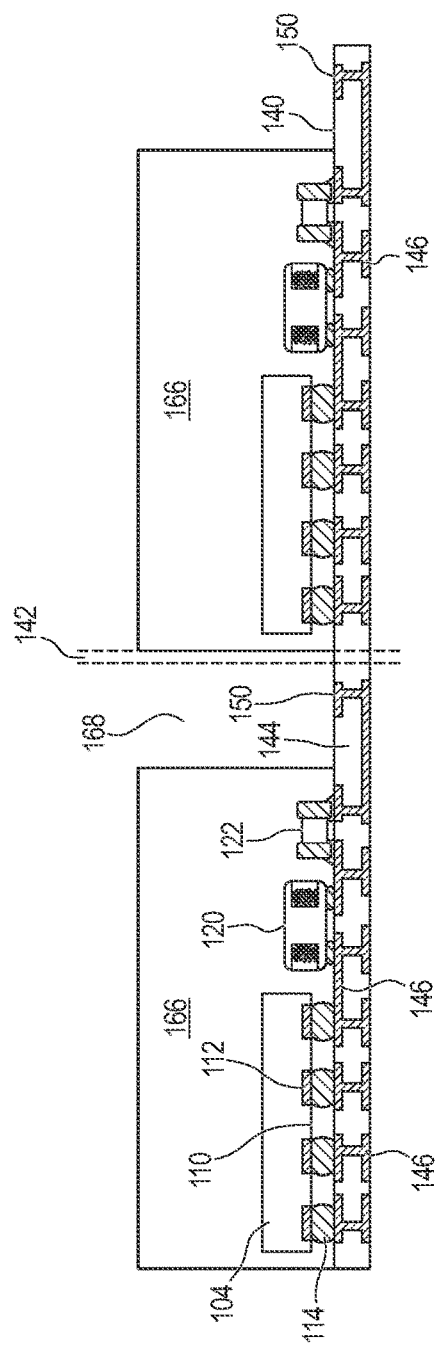

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIGS. 1a-1d illustrate a method of packaging a semiconductor die 104. Semiconductor die 104 includes an active surface 110 with contact pads 112 for electrical interconnection of external devices to the circuits formed on and in the semiconductor die. Bumps 114 are disposed on contact pads 112. Other interconnect structure types, such as stud bumps, conductive pillars, or bond wires are used in other embodiments.

Semiconductor die 104 is packaged along with inductor 120, capacitor 122, and any other desired electrical components by disposing the components on a substrate 140 in FIG. 1a. In one embodiment, inductor 120 and capacitor 122 form a radio frequency (RF) filter for signals to or from semiconductor die 104. In other embodiments, any electrical component or combination of electrical components can be disposed on substrate 140 for any desired purpose. Bumps 114 are reflowed to mechanically and electrically connect semiconductor die 104 to substrate 140. Similarly, a solder material disposed between components 120-122 is reflowed to connect those components. In some embodiments, the solder material for discrete components 120-122 is a solder paste printed onto substrate 140 prior to surface mounting the components to the substrate.

FIG. 1a shows a partial cross-sectional view of substrate 140. The illustrated portion of substrate 140 includes room for forming two packages separated by saw streets 142. However, the entirety of substrate 140 will commonly include room for forming hundreds, thousands, or even more packages in parallel.

Substrate 140 is formed from a base insulating material 144 with conductive layers 146 formed over outer surfaces of the substrate or interleaved between layers of the insulating material. Conductive layers 146 include contact pads, conductive traces, and conductive vias configured as necessary to implement a desired signal routing. Portions of conductive layers 146 are electrically common or electrically isolated depending on the design and function of the device being formed. Conductive layers 146 are formed using PVD, CVD, electrolytic plating, electroless plating, or other suitable metal deposition process. Conductive layers 146 can be one or more layers of aluminum (Al), copper (Cu), tin (Sn), nickel (Ni), gold (Au), silver (Ag), or other suitable electrically conductive material. In some embodiments, passivation or solder resist layers are formed over the top and bottom surfaces of substrate 140 with openings to expose contact pads of conductive layer 146.

Substrate 140 can also be any suitable laminate interposer, PCB, wafer-form, strip interposer, leadframe, or other type of substrate. Substrate 140 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Insulating material 144 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide (PI), benzocyclobutene (BCB), polybenzoxazoles (PBO), and other material having similar insulating and structural properties. Substrate 140 can also be a multi-layer flexible laminate, ceramic, copper clad laminate, glass, or semiconductor wafer including an active surface containing one or more transistors, diodes, and other circuit elements to implement analog or digital circuits.

Semiconductor die 104 are flip-chip mounted onto substrate 140 and electrically connected to conductive layer 146 by conductive bumps 114. In some embodiments, the components disposed on substrate 140 comprise a system-in-package (SiP) module. The components mounted onto substrate 140 can include semiconductor die, semiconductor packages, discrete active or passive components, or any other suitable electrical component.

Conductive layers 146 include terminals 150 for external interconnection. Terminals 150 are formed on the top surface of substrate 140, which is the same surface that semiconductor die 104 is mounted on, and will remain exposed in the final package for electrical connection to another adjacent device or package. Terminals 150 are contact pads formed on the top surface of substrate 140. In other embodiments, terminals 150 include additional structural aspects, such as headers, alignment detents, attachment clips, or male or female sockets for corresponding attachment mechanisms. Terminals 150 also allow external access for other purposes than connecting to adjacent devices, e.g., jumpers or switches for user modifiable settings, buttons for interacting with the circuits of package 170, or signal pads for debug or diagnostic purposes.

FIG. 1B shows substrate 140 with semiconductor die 104 disposed in a mold 160. Mold 160 shapes a deposited encapsulant into the desired shape for the semiconductor package. Mold 160 includes extensions 162 extending to and contacting terminals 150, to substantially block the molding compound from covering the terminals. Other methods of keeping terminals 150 free of molding compound are used in other embodiments. The molding compound is deposited with a mask over terminals 150 in one embodiment. In another embodiment, molding compound is deposited over the entirety of substrate 140, including terminals 150, and then partially removed to expose the terminals using laser drilling, mechanical drilling, chemical etching, or another suitable process.

FIG. 1c shows encapsulant 166 after being deposited on substrate 140 and over components 104, 120, and 122 using a paste printing, compressive molding, transfer molding, liquid encapsulant molding, vacuum lamination, spin coating, or another suitable applicator. Encapsulant 166 can be polymer composite material, such as epoxy resin, epoxy acrylate, or polymer with or without a filler. Encapsulant 166 is non-conductive, provides structural support, and environmentally protects the semiconductor device from external elements and contaminants. Encapsulant 166 includes an opening 168 formed over terminals 150 where extensions 162 of mold 160 blocked encapsulant.

Figure 1D:
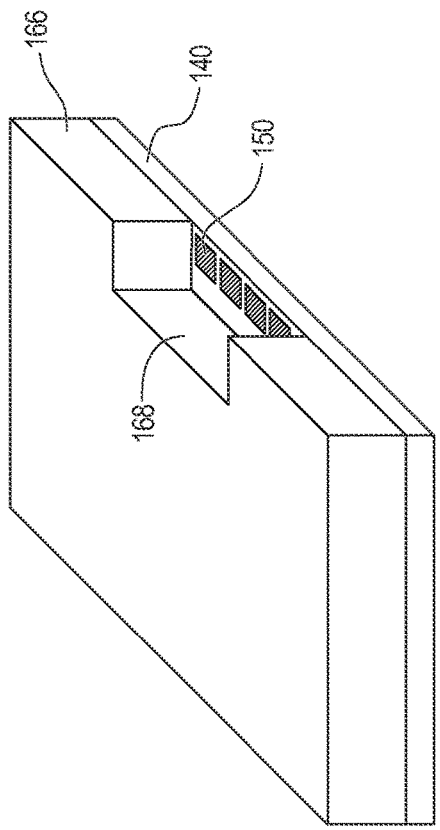

Substrate 140 with encapsulant 166 is removed from mold 160, if used, and singulated through saw streets 142 using a laser cutting tool, saw blade, water cutting tool, or another suitable means to form individual packages 170. FIG. 1d illustrates a perspective view of package 170 after singulation showing the position of terminals 150 and opening 168 relative to the package as a whole. Opening 168 only extends over terminals 150 and a small periphery of the terminals. In other embodiments, terminal 150 can be located in other spots on substrate 140, as illustrated in FIGS. 6a-6c or otherwise, with opening 168 moved accordingly. Opening 168 is formed larger than the combined footprints of terminals 150 in other embodiments to ease manufacturing requirements. For instance, opening 168 can be formed as a stripe along the entire length or width of a panel of units, and therefore extending completely across each unit individually, rather than as a discrete opening per unit. Terminals 150 remain exposed for electrical interconnection of package 170 to another device.

Figure 2A:
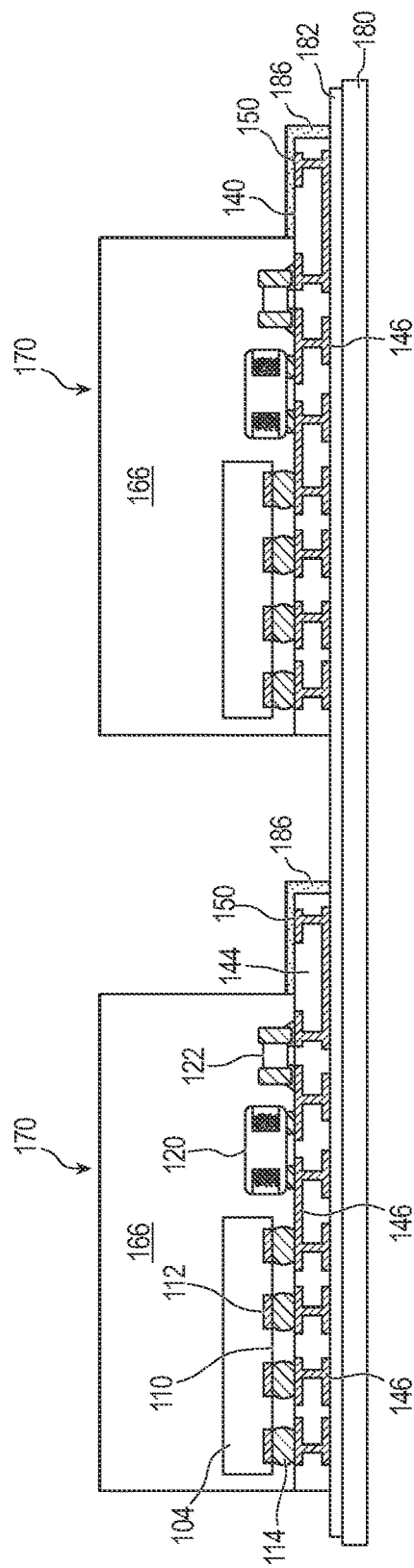
FIGS. 2a-2f illustrate forming an electromagnetic interference (EMI) shielding layer over the semiconductor package and using a film mask to remove the shielding layer over the exposed terminals.

FIGS. 2a-2f illustrate one method of forming an electromagnetic interference (EMI) shielding layer over semiconductor packages 170 while leaving terminals 150 exposed. In FIG. 2a, semiconductor packages 170 are disposed on carrier 180 with an optional thermal release, ultraviolet (UV) release, adhesive, or other suitable interface layer 182. Carrier 180 is a panel of glass, aluminum, steel, copper, polymer, silicon, or another suitable material, with a sufficient rigidity to support a number of packages 170 to be processed together. Only two packages 170 are illustrated, but hundreds, thousands, or more packages are typically processed at once. In some embodiments, carrier 180 is the same carrier that was used in the processing steps of FIGS. 1a-1d. Packages 170 can be left in place after singulation rather than being disposed on a different carrier for application of EMI shielding.

A sputter mask 186 is disposed over terminals 150 of each package 170. Sputter mask 186 is cut from an insulating film in one embodiment. The film stock for mask 186 is laminated flat over a carrier and then cut to the desired size. Sputter mask 186 is cut to approximately the size of the footprint of opening 178. Optionally, sputter mask 186 is formed large enough to extend over the side surface of substrate 140 adjacent to terminals 150. Sputter masks 186 can also be cut smaller than opening 168 as long as the mask is large enough to cover any desired terminals.

Figure 2B:
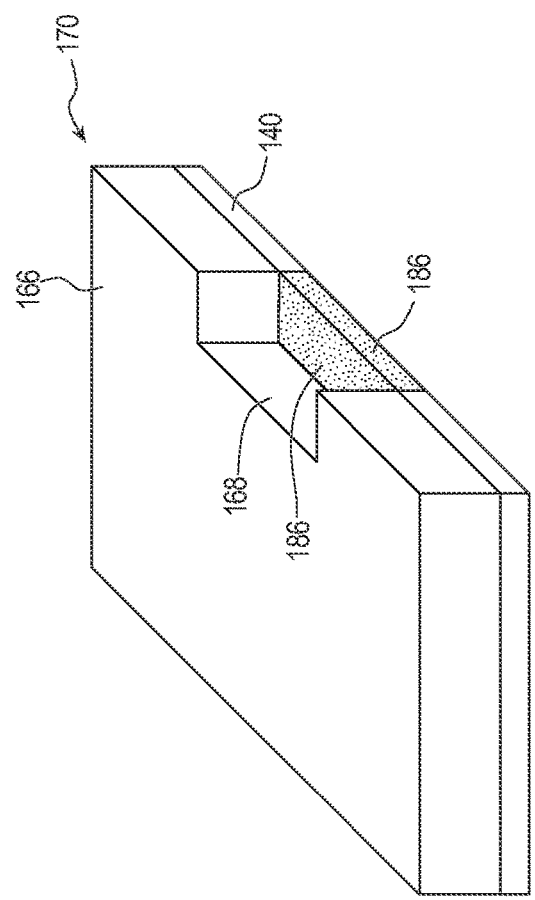

Once the film is cut, sputter masks 186 can be picked and placed over terminals 150. FIG. 2a shows a cross-section of mask 186 attached over terminals 150, and FIG. 2b shows a perspective view. The film for mask 186 can be metal, PI, PTFE, plastic, rubber, other polymers, fiber, paper, or any other suitable material. An adhesive is optionally used to attach mask 186 to substrate 140.

Figure 2C:
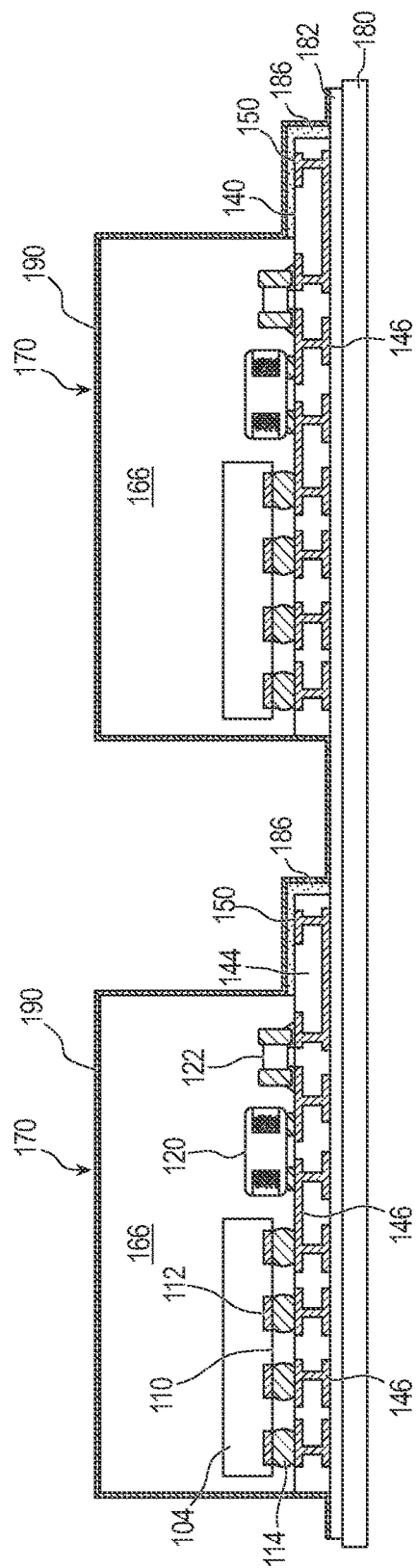
Figure 2D:
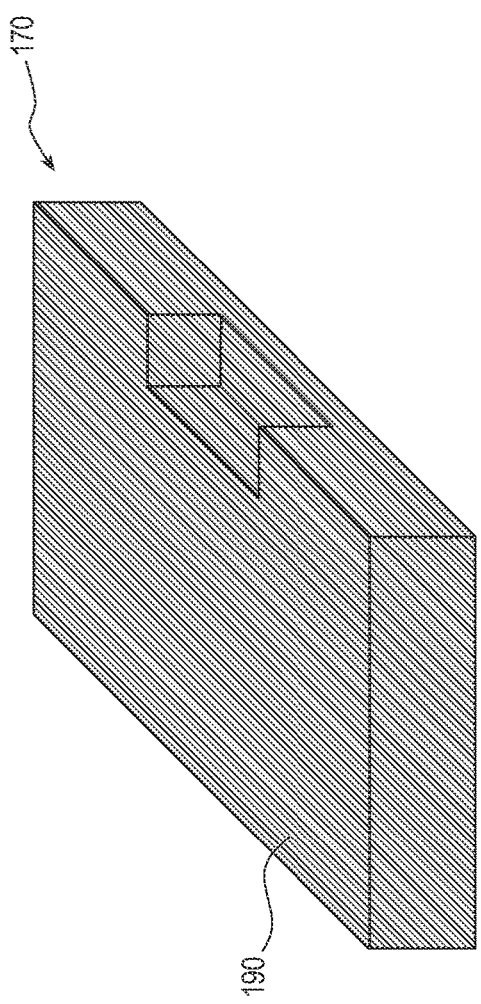

In FIGS. 2c and 2d, a conductive material is sputtered over packages 170 to form conformal shielding layer 190. Shielding layer 190 is formed by any suitable metal deposition technique, e.g., chemical vapor deposition, physical vapor deposition, other sputtering methods, or electroless plating. Shielding layer 190 completely covers the exposed tops and sides of encapsulant 166, substrate 140, and mask 186. In some embodiments, a portion of conductive layer 146 in substrate 140 is exposed at a side of the substrate to physically contact shielding layer 190 and electrically connect the shielding layer to a ground voltage node.

Figure 2E:
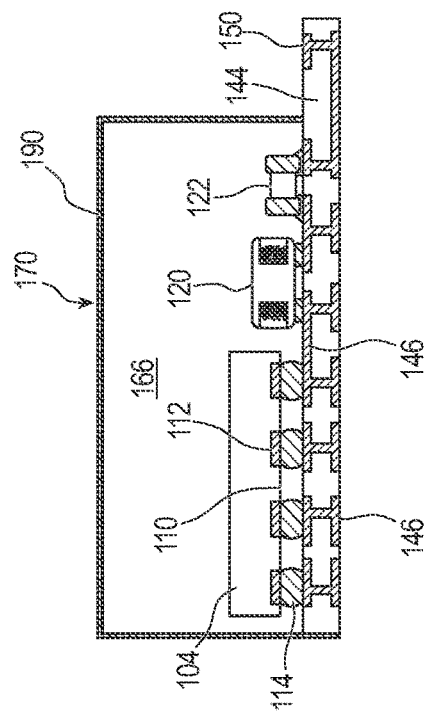
Figure 2F:
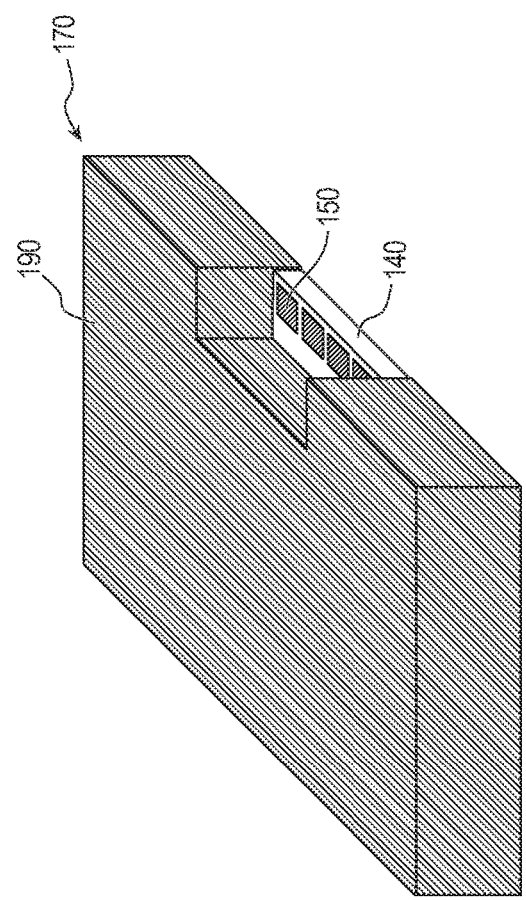

In FIGS. 2e and 2f, mask 186 is removed, along with the portion of shielding layer 190 over terminals 150. Mask 186 can be detached using thermal, chemical, UV, or another suitable release mechanism. In other embodiments, mechanical peeling is used to remove mask 186 without an additional release mechanism. Removal of mask 186 leaves shielding layer 190 completely covering the top and all side surfaces of encapsulant 166, including within opening 168, and the side surfaces of substrate 140 while exposing terminals 150 for electrical interconnect. Shielding layer 190 completely surrounds the top and all sides of semiconductor die 104. Packages 170 are removed from carrier 180, which separates the portions of shielding layer 190 between packages. Packages 170 can be installed onto the substrate of a larger electronic device using a pick and place operation, packaged into a tape and reel for delivery, or otherwise disposed.

Semiconductor package 170 is fully shielded by shielding layer 190 except for an open socket or terminal area for terminals 150 or another type of terminal or socket. Shielding layer 190 sufficiently blocks electromagnetic noise generated by components within package 170 from radiating and causing malfunction in nearby devices, and vice versa.

Figure 3A:
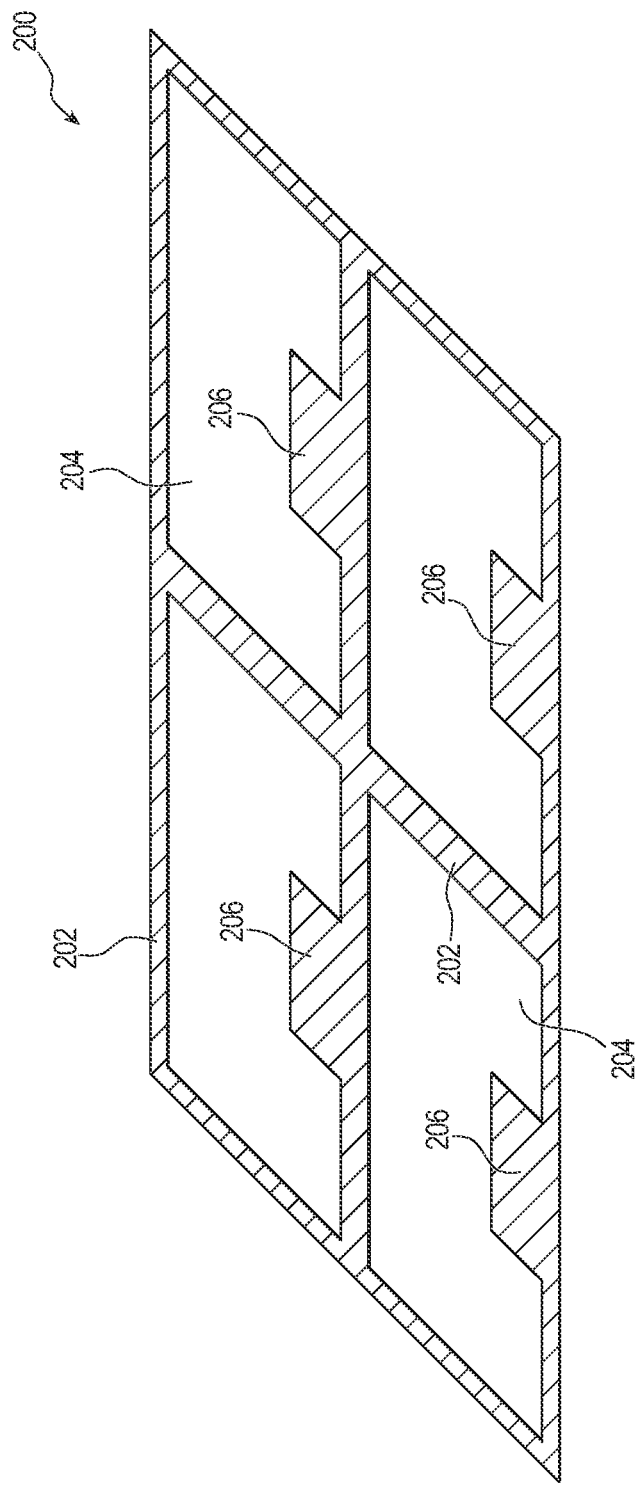
FIGS. 3a-3e illustrate forming an EMI shielding layer over the semiconductor package using a jig to block the shielding layer over the exposed terminals.

FIGS. 3a-3e illustrate another method of forming an electromagnetic interference (EMI) shielding layer over semiconductor packages 170 while leaving terminals 150 exposed. FIG. 3a shows a jig 200 for mounting a plurality of packages 170 from FIG. 1d. While only four packages 170 are illustrated, a larger jig is provided that can hold hundreds or thousands of devices in other embodiments. Jig 200 includes a frame 202 oriented in a grid with a plurality of device openings 204 formed by the frame. Device openings 204 are slightly larger than the footprint of packages 170 so that the packages fit within the device openings. A tab 206 extends from frame 202 into each device opening 204. Tabs 206 are approximately the same size as, or slightly smaller than, opening 168 of encapsulant 166.

Figure 3B:
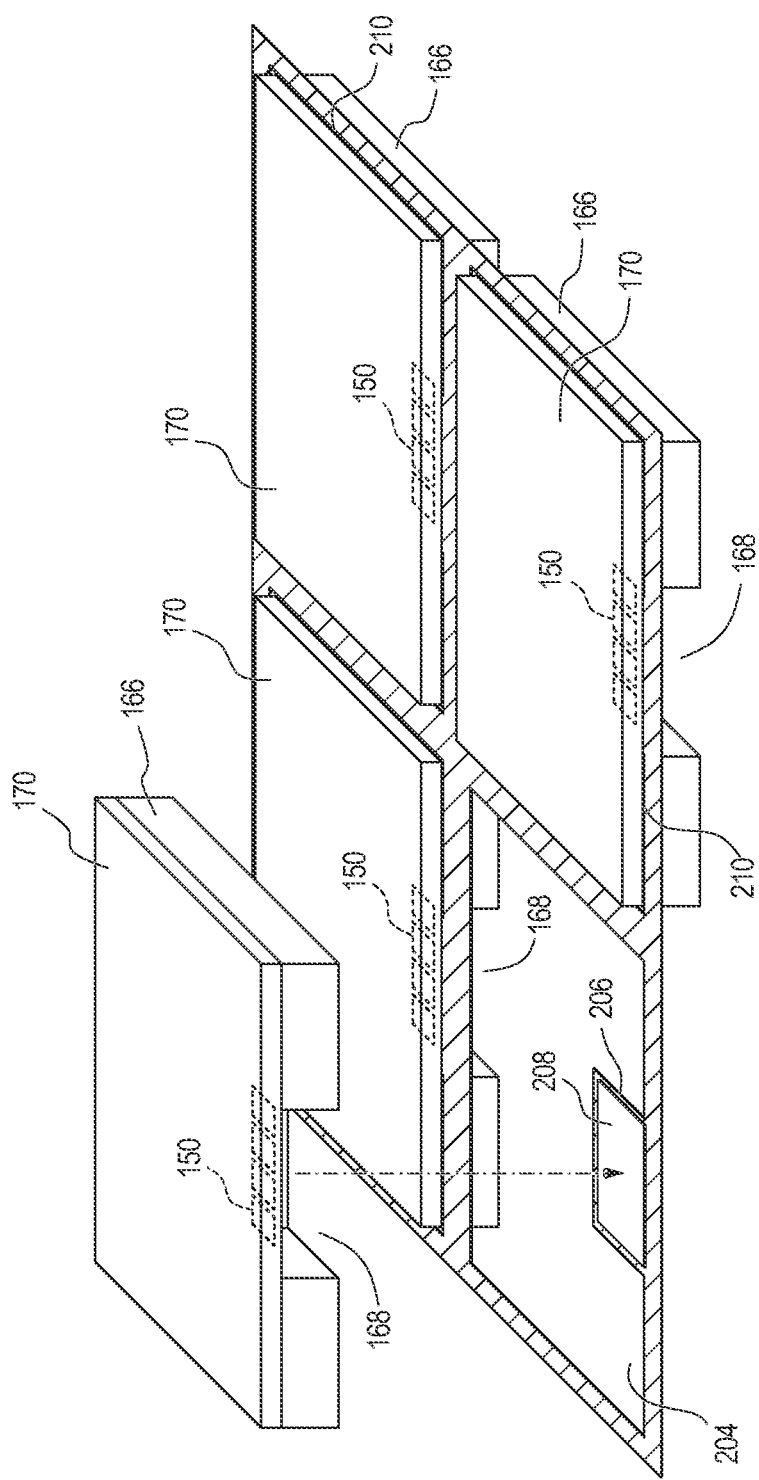

In FIG. 3b, a plurality of packages 170 are flipped and disposed on jig 200 with tab 206 covering terminals 150. An optional insulating layer 208 is disposed on tabs 206 to aid in the attachment of packages 170 to tab 206, and also to ensure a seal that fully masks sputtered metal from covering terminals 150. Insulating layer 208 is formed similarly to mask 186 above, and from similar materials. In one embodiment, insulating layer 208 is a PI layer. Tab 206 or insulating layer 208 physically contacts substrate 140 over terminals 150, while a gap 210 is present around the remainder of packages 170. Jig 200 only contacts packages 170 at the interface between tabs 206 and substrates 140. Gap 210 is a portion of device opening 204 that completely surrounds package 170 between the package and frame 202 other than the area where tab 206 exists.

Figure 3C:
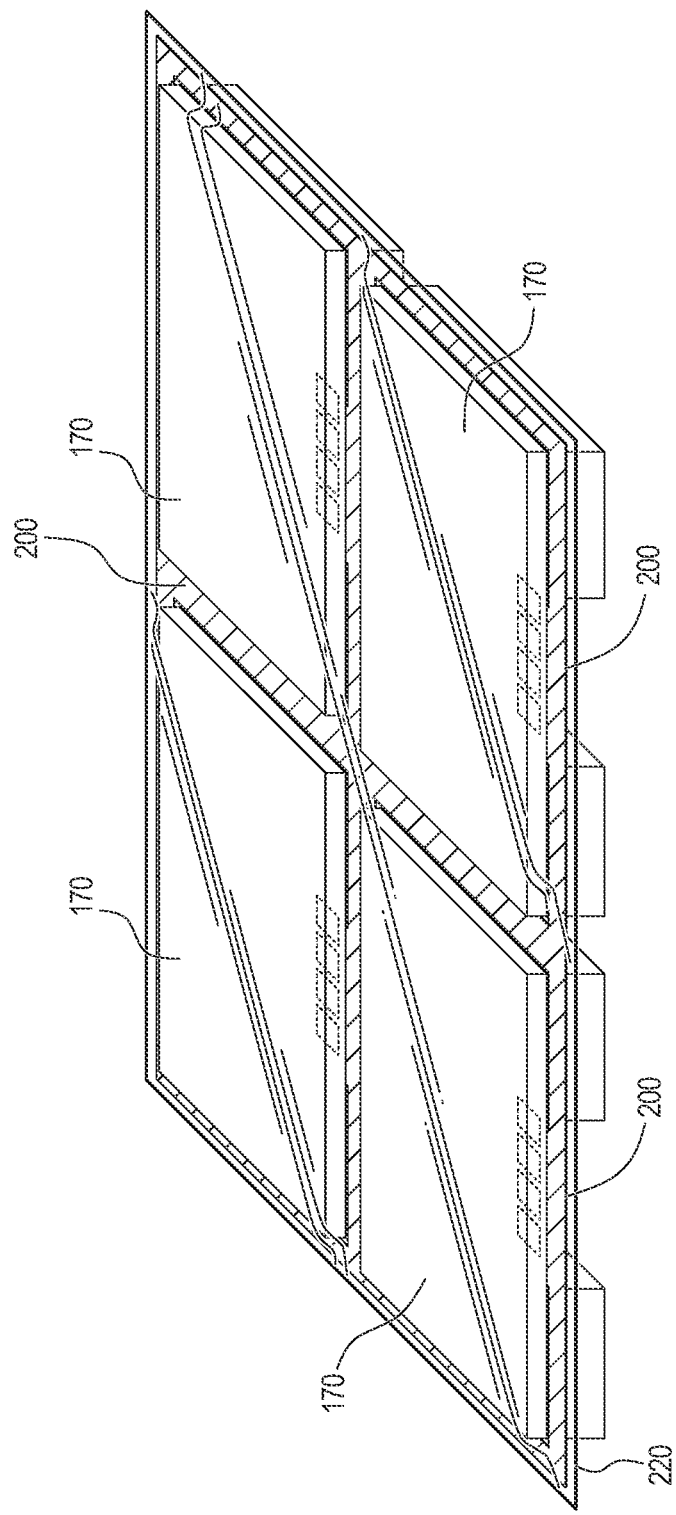

In FIG. 3c, an insulating film 220 is laminated over jig 200 and packages 170. Insulating film 220 is formed of any suitable material for sputter mask 186 and cut slightly larger than jig 200, or at least large enough to cover all packages 170. Insulating film 220 includes an adhesive between the film and packages 170 in one embodiment. Insulating film 220 is disposed over the bottoms of packages 170 such that the area of substrate 140 with terminals 150 is between film 220 and tab 206 of jig 200. Insulating film 220 is a carrier film in one embodiment, allowing jig 200 to be flipped over for sputtering without disturbing the mounting of packages 170 on the jig. Insulating film 220 also acts as a mask for the bottom of substrate 140 so that contacts of conductive layer 146 on the bottom of the substrate are not covered during sputtering.

Figure 3D:
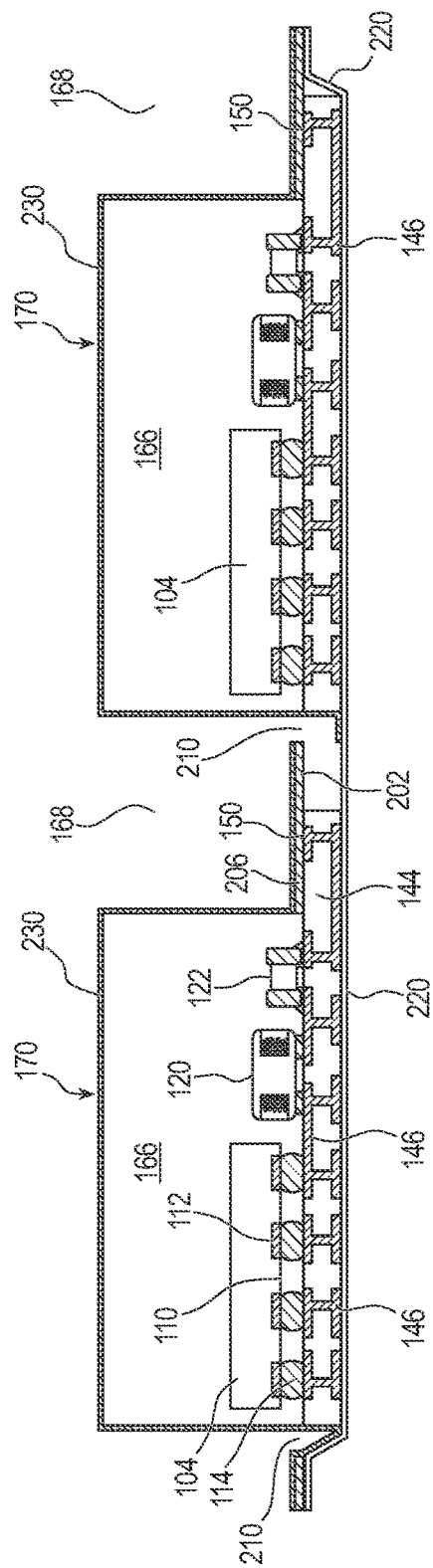

In FIG. 3d, a shielding layer 230 is formed over packages 170 and jig 200 similarly to shielding layer 190 in FIG. 2c. Shielding layer 230 completely covers top and side surfaces of encapsulant 166, including within opening 168. The sputtering projects material through gap 210 to cover the side surfaces of substrate 140, other than where blocked by tab 206. Tab 206 also blocks shielding layer 230 from covering terminals 150. Shielding layer 230 is formed over terminals 150, and then that portion of the shielding layer is removed when packages 170 are removed from jig 200.

Figure 3E:
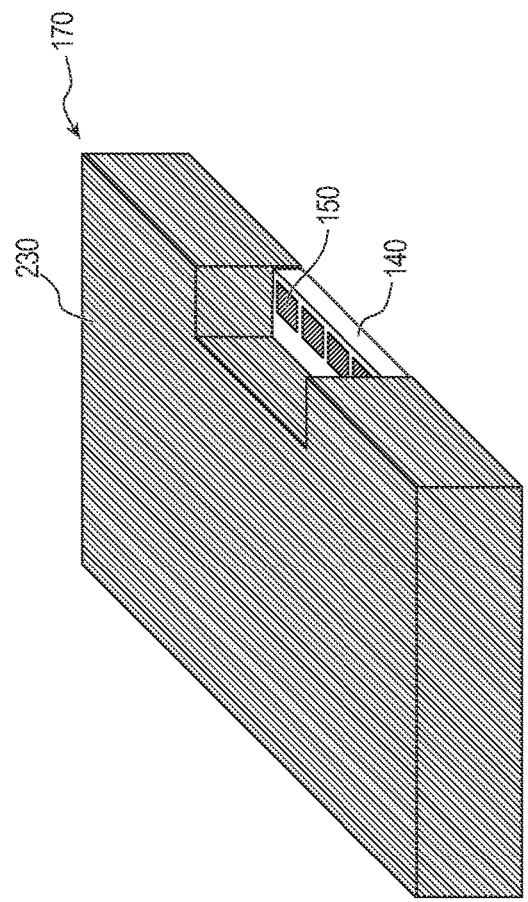

FIG. 3e illustrates a package 170 removed from jig 200 after shielding layer 230 is formed. Insulating film 220 is removed using a thermal or UV release, or mechanical peeling. In some embodiments, packages 170 are removed from jig 200 along with insulating film 220, and then released from the insulating film.

Figure 4A:
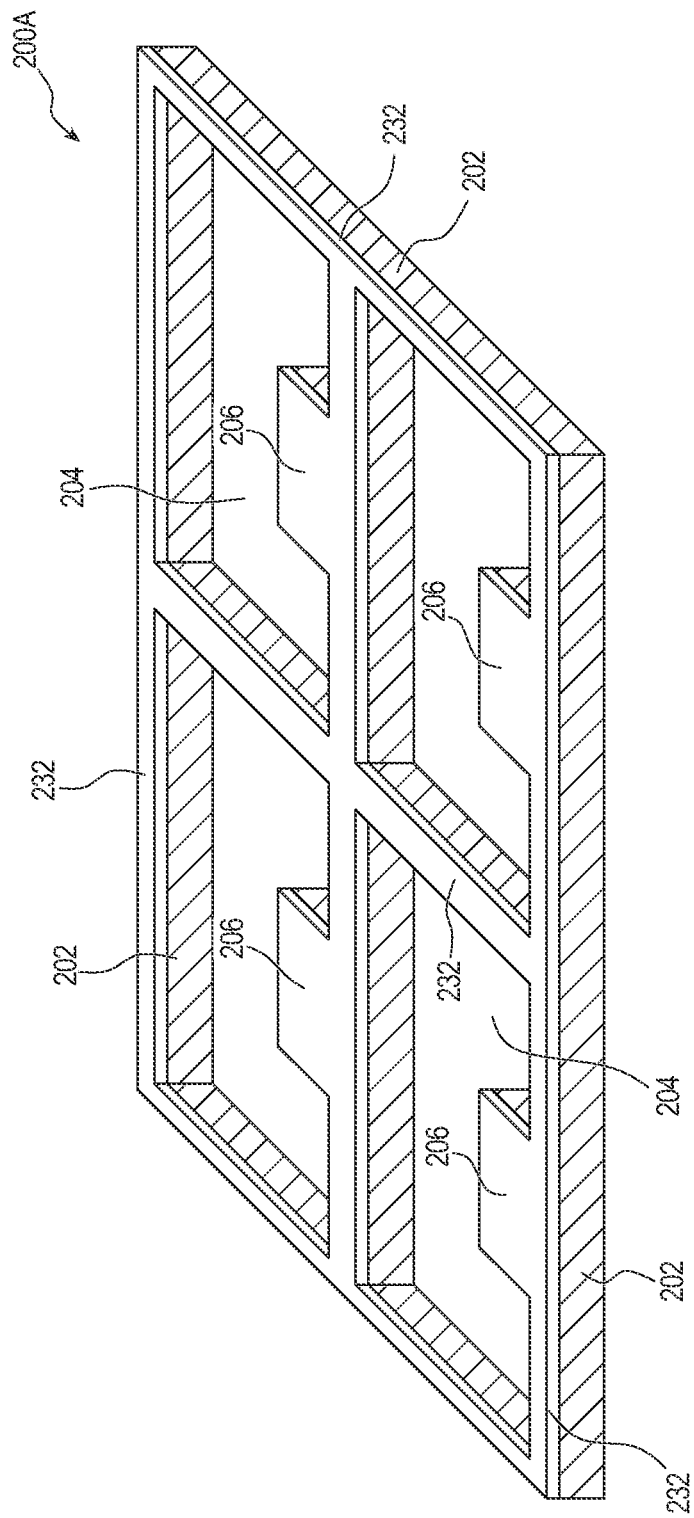
FIGS. 4a-4d illustrate a second jig embodiment.

FIGS. 4a-4d illustrate forming a package with an alternative jig embodiment. FIG. 4a shows jig 200a, which is similar to jig 200 above. Jig 200a has the same footprint as jig 200, i.e., with frame 202 surrounding device openings 204 and a tab 206 configured to cover terminals 150. Jig 200a is vertically thicker than jig 200, and includes an insulating layer 232 covering the entire top surface of the jig. Insulating layer 232 is similar to insulating layer 208 above, but covers the entire top surface of jig 200a. In some embodiments, jig 200a is cut from a sheet of metal with a sheet of insulating material already on the metal to get the same footprint for jig 200a and insulating layer 232.

Figure 4B:
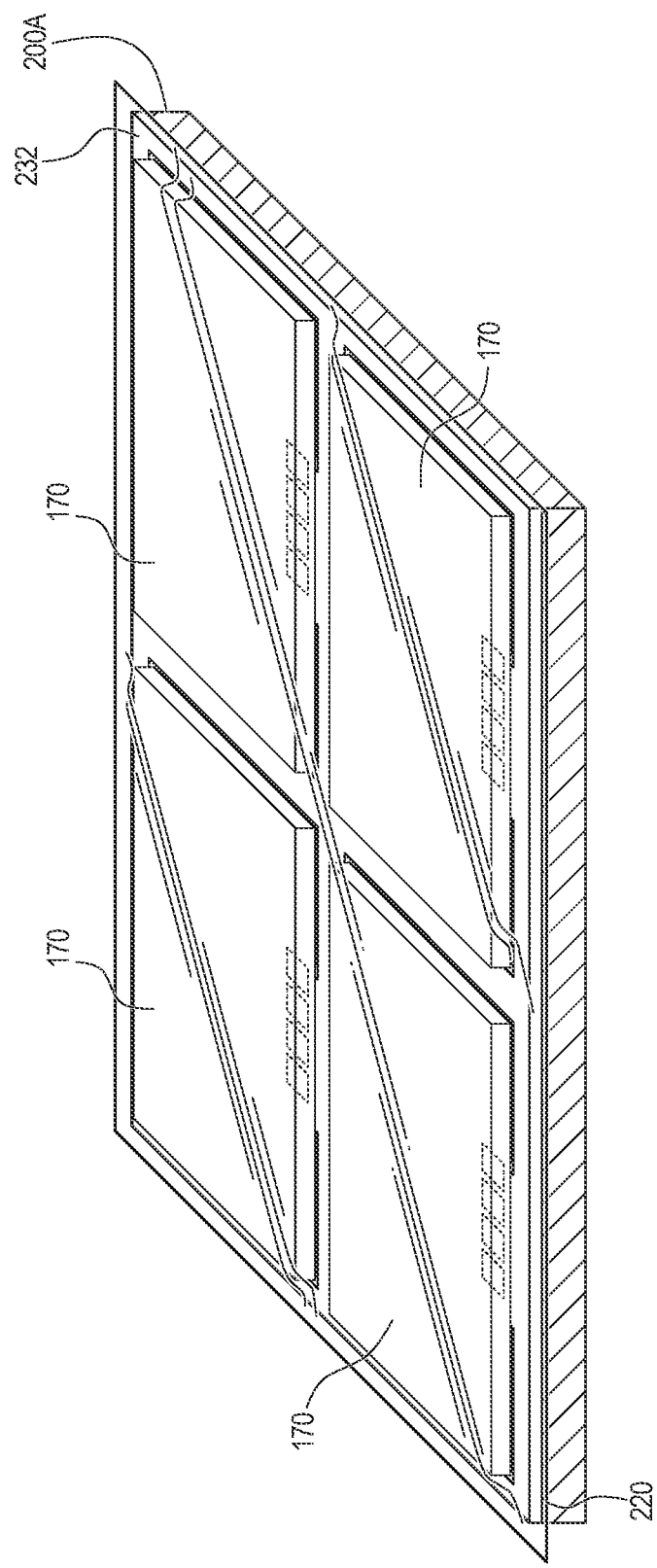

A thickness of jig 200 and insulating layer 232 in combination is configured to be approximately equal to a thickness of encapsulant 166. When packages 170 are disposed on frame 200a as shown in FIG. 4b, the top surface of encapsulant 166, which is oriented downward in FIG. 4b, is coplanar or approximately coplanar with the bottom surface of jig 200a, which is opposite insulating layer 232. Having coplanar surfaces aids in application of insulating film 220 because jig 200a and packages 170 can both be properly supported on a carrier. In some embodiments, jig 200 in FIGS. 3a-3d is similarly made as thick as encapsulant 166, either alone or in combination with insulating layer 208.

Figure 4C:
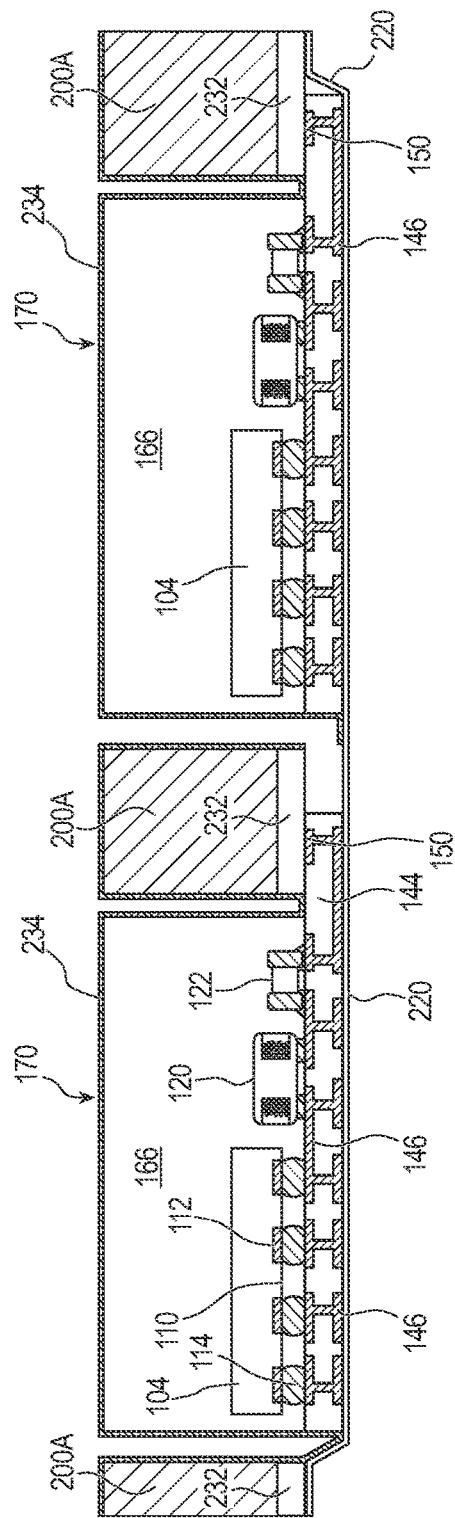
Figure 4D:
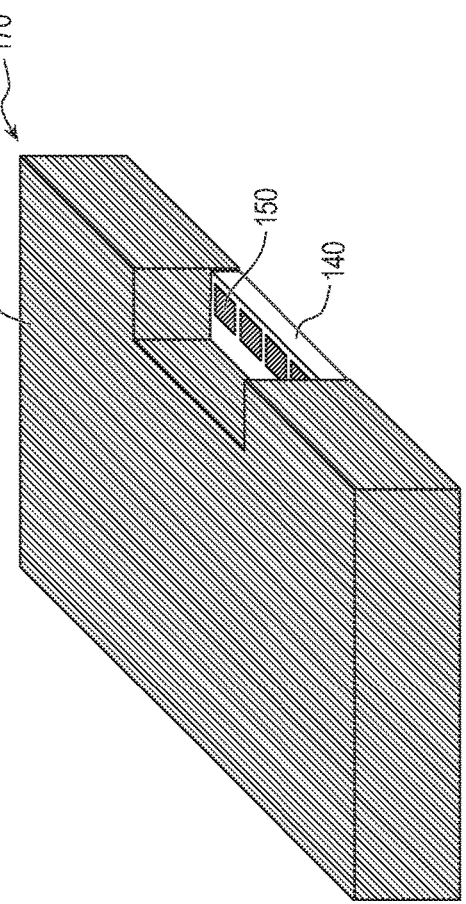

FIG. 4c illustrates jig 200a with packages 170 flipped over so that encapsulant 166 is oriented upward. A shielding layer 234 is sputtered or otherwise disposed over packages 170 and jig 200a. The top horizontal surfaces of packages 170 and jig 200a that shielding layer 234 is formed on are the aforementioned coplanar surfaces. A gap exists between jig 200a and encapsulant 166 in opening 168, which allows the side surfaces of the encapsulant around terminals 150 to be covered in shielding layer 234. In other embodiments, tab 206 is sized to completely fill opening 168 and substantially prevent shielding layer 234 from forming over one or more side surfaces. FIG. 4d shows packages 170 removed from jig 200a after forming shielding layer 234.

Figure 5A:
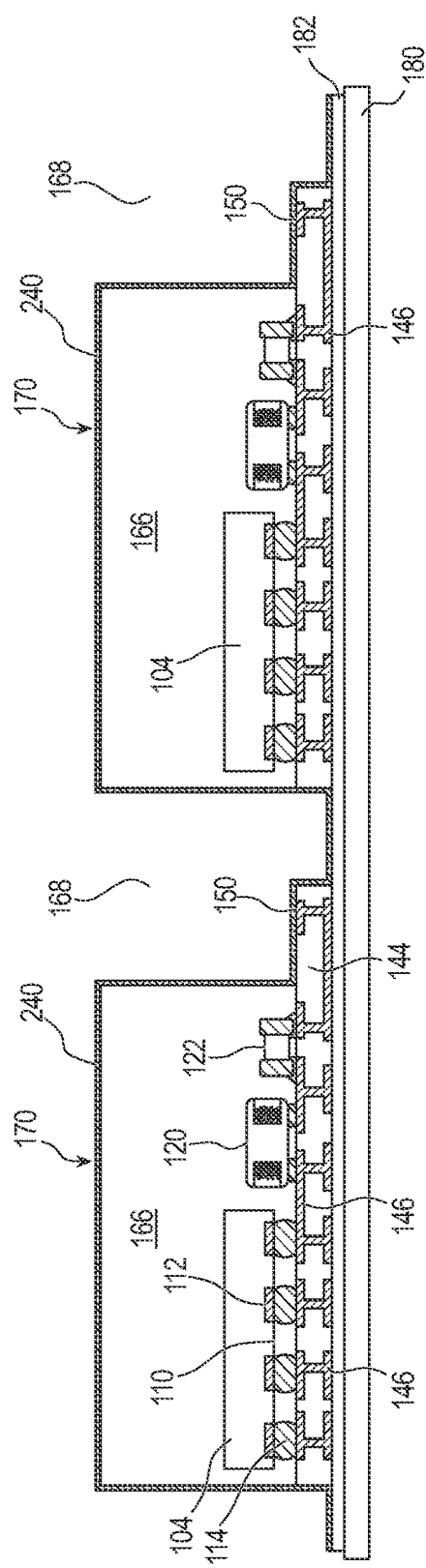
FIGS. 5a-5d illustrate using laser ablation to remove the EMI shielding layer over the exposed terminals.
Figure 5B:
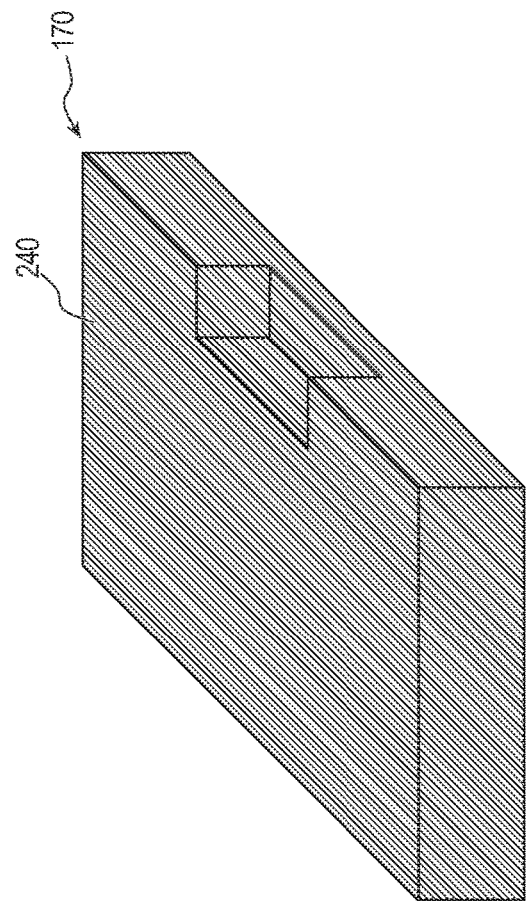

FIGS. 5a-5d illustrate another method of forming an electromagnetic interference (EMI) shielding layer over semiconductor packages 170 while leaving terminals 150 exposed. Packages 170 are disposed on carrier 180 in FIG. 5a, similar to in FIG. 2a. A shielding layer 240 is formed over packages 170, including directly onto terminals 150, similar to in FIG. 2c but without a sputter mask. FIG. 5b shows a perspective view of package 170 completely covered by shielding layer 240.

Figure 5C:
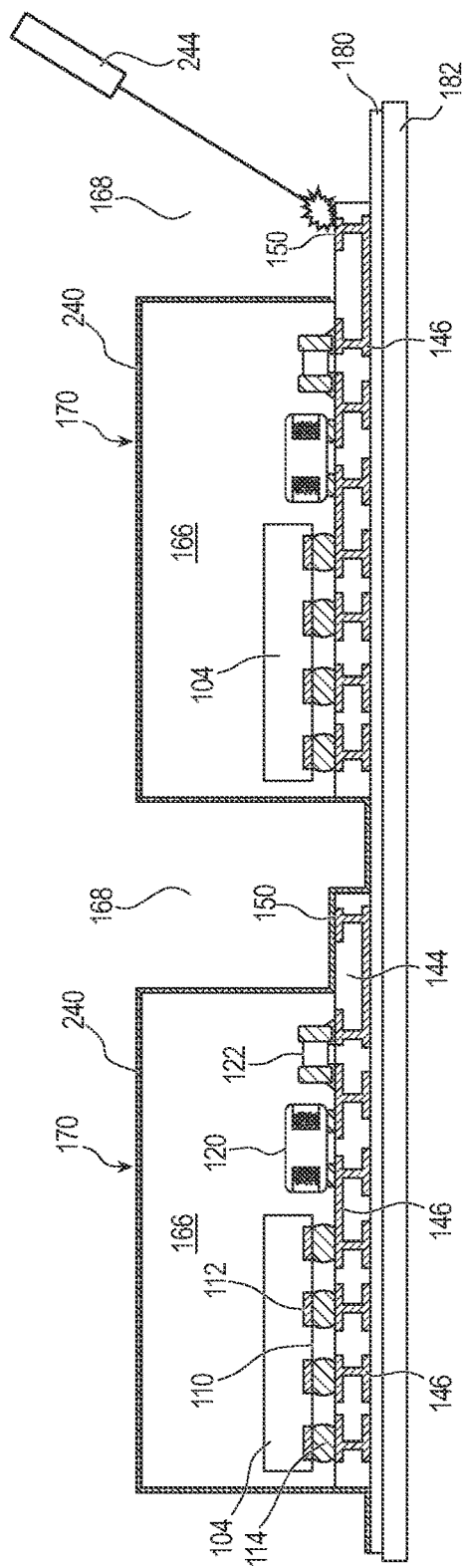
Figure 5D:
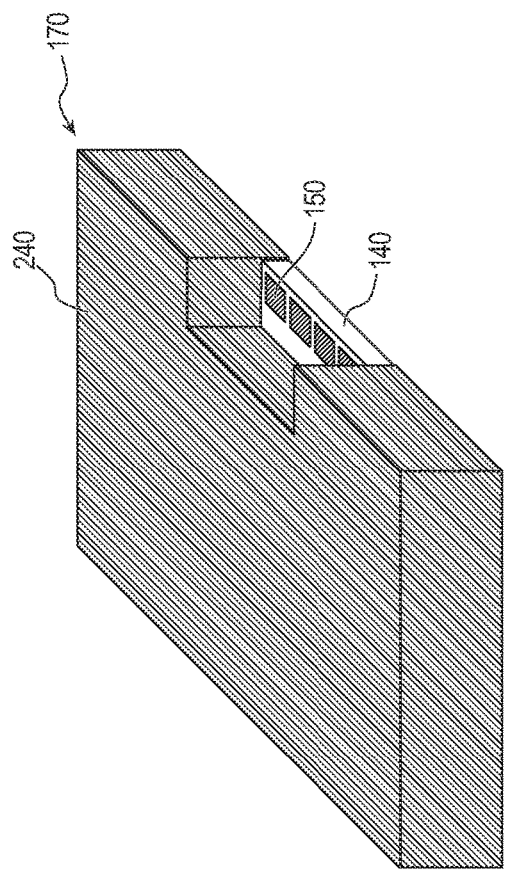

In FIG. 5c, laser ablation is performed with laser 244 to remove a portion of shielding layer 240 over terminals 150. Laser 244 is a diode-pumped solid-state (DPSS) laser, an exciplex laser with ArF, KrF, XeCl, XeF, or another suitable excimer, ultraviolet, visible, infrared, a yttrium aluminum garnet (YAG) laser doped with neodymium, erbium, ytterbium, or another suitable material, or a $CO_2$ laser with μs, ns, ps, or fs pulses. Laser 244 can be a single laser, a dual laser system, or a multi-laser setup with or without a slight angle in the optical system. Various lenses can be used as desired, e.g., focus, collimator, apochromat, achromat. Mirrors, scanners, slits, filters, or other suitable devices can be used to guide or condition the light signal from laser 244. Energy emitted by laser 244 strips shielding layer 240 from over terminals 150 to electrically isolate the terminals from the shielding layer. FIG. 5d illustrates package 170 with shielding layer 240 removed over terminals 150. Shielding layer 240 over the side surface of substrate 140 adjacent to terminals 150 is optionally removed by laser 244.

FIGS. 6a-6c illustrate alternative locations for the terminal or socket on the package. In FIG. 6a, package 250 includes terminals 252 formed on the left edge of the package. FIG. 6b shows package 260 with terminals 262 formed on the right edge of the package. FIG. 6c shows semiconductor package 270 with terminals 272 centrally located within the package rather than at an edge of the package. Any of the packages 250, 260, or 270 can be formed by any of the above described methods by changing the location of extension 162 within mold 160. A terminal or socket can be located anywhere within the footprint of a semiconductor package and have any desired shape. Multiple terminals or sockets can be formed at separate locations of the package.

Figure 7A:
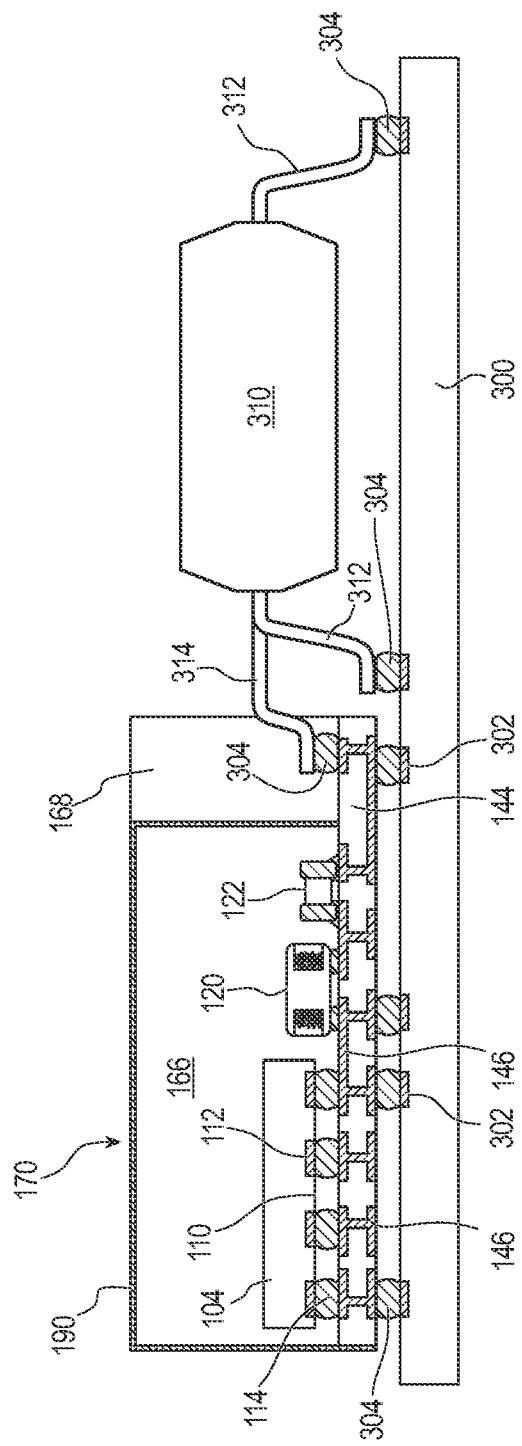
FIGS. 7a and 7b illustrate one of the shielded semiconductor packages incorporated into an electronic device.
Figure 7B:
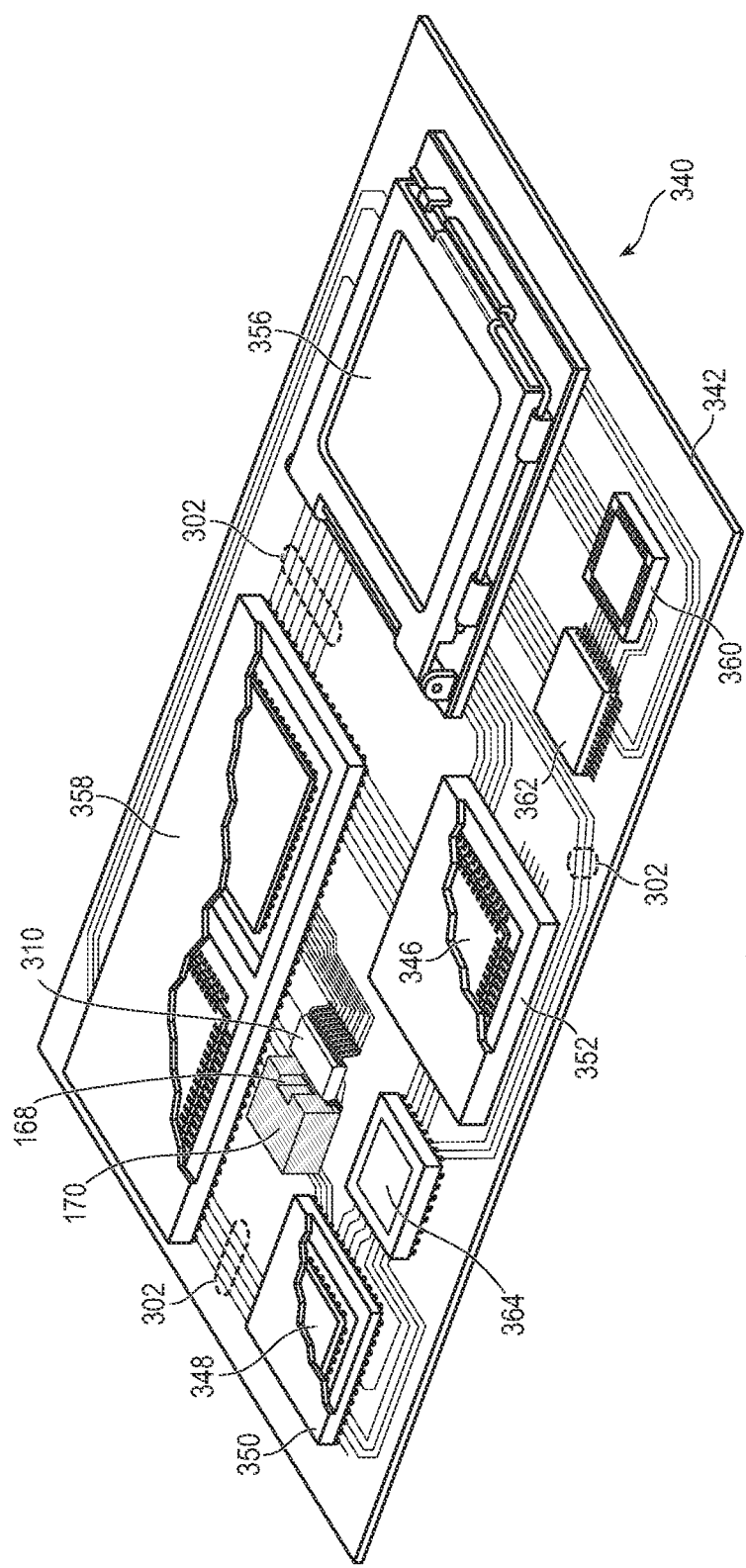

FIGS. 7a and 7b illustrate incorporating the above described shielded packages, e.g., package 170 with shielding layer 190 from FIG. 2f, into an electronic device. FIG. 7a illustrates a partial cross-section of package 170 mounted onto a PCB or other substrate 300 as part of an electronic device. Bumps 304 are formed on contact pads of conductive layer 146 on the opposite side of substrate 140 from semiconductor die 104. Conductive bumps 304 can be formed at any stage of the manufacturing process, e.g., prior to molding in FIG. 1B, prior to singulation in FIG. 1c, or after forming shielding layer 190, 230, or 240. Bumps 304 are reflowed onto conductive layer 302 of PCB 300 to physically attach and electrically connect package 170 to the PCB. In other embodiments, thermocompression or other suitable attachment and connection methods are used. In some embodiments, an adhesive or underfill layer is used between package 170 and PCB 300. Semiconductor die 104 is electrically coupled to conductive layer 302 through bumps 114, conductive layers 146, and bumps 304.

A second semiconductor package 310 is disposed on substrate 140 adjacent to package 170. Package 310 includes legs 312 attached to PCB 300 by bumps 304. In addition, package 310 includes legs 314 physically attached and electrically connected to terminals 150 by bumps 304. Terminals 150 are exposed from package 170 on top of substrate 140, allowing direct connection between package 170 and an adjacent semiconductor package, e.g., package 310. Packages 170 and 310 include cooperative circuit elements that work in concert to achieve a desired electrical function. The above described methods result in a semiconductor package with not only shielding layer 190 formed completely around semiconductor die 104 and other RF circuits on substrate 140, but also an exposed terminal or socket outside the shielding layer. Shielding layer 190 protects semiconductor package 310 from EMI released by the RF circuits in package 170. Package 310 could also be coupled to terminals 150 by cables, bond wires, conductive traces of a substrate of package 310, or any other suitable interconnect structure instead of legs 314.

FIG. 7b illustrates electronic device 340 including PCB 300 with a plurality of semiconductor packages mounted on a surface of the PCB, including packages 170 and 310. Electronic device 340 can have one type of semiconductor package, or multiple types of semiconductor packages, depending on the application.

Electronic device 340 can be a stand-alone system that uses the semiconductor packages to perform one or more electrical functions. Alternatively, electronic device 340 can be a subcomponent of a larger system. For example, electronic device 340 can be part of a tablet computer, cellular phone, digital camera, communication system, or other electronic device. Electronic device 340 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 7b, PCB 300 provides a general substrate for structural support and electrical interconnection of the semiconductor packages mounted on the PCB. Conductive signal traces 302 are formed over a surface or within layers of PCB 300 using evaporation, electrolytic plating, electroless plating, screen printing, or other suitable metal deposition process. Signal traces 302 provide for electrical communication between the semiconductor packages, mounted components, and other external systems or components. Traces 302 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 300. In other embodiments, a semiconductor device may only have the first level packaging where the die is mechanically and electrically mounted directly to PCB 300.

For the purpose of illustration, several types of first level packaging, including bond wire package 346 and flipchip 348, are shown on PCB 300. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 300 along with packages 170 and 310. Conductive traces 302 electrically couple the various packages and components disposed on PCB 300 to packages 170 and 310, giving use of the components within packages 170 and 310 to other components on the PCB.

Depending upon the system requirements, any combination of semiconductor packages, configured with any combination of first and second level packaging styles, as well as other electronic components, can be connected to PCB 300. In some embodiments, electronic device 340 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    depositing an encapsulant over a surface of the substrate, wherein a portion of the surface of the substrate including a plurality of contact pads is exposed from the encapsulant;
    providing a jig;
    disposing an insulating layer on a tab of the jig;
    disposing the substrate over the jig with the tab of the jig over the portion of the surface of the substrate and the portion of the surface of the substrate on the insulating layer;
    forming a shielding layer over the encapsulant; and
    removing a portion of the shielding layer to expose the portion of the surface of the substrate.

2. The method of claim 1, wherein the portion of the surface of the substrate includes a contact pad.

3. The method of claim 2, further including providing a semiconductor package comprising an interconnect structure of the semiconductor package connected to the contact pad.

4. A method of making a semiconductor device, comprising:
    providing a substrate;
    disposing a radio frequency (RF) electrical component over a first portion of a surface of the substrate;
    depositing an encapsulant over the first portion of the surface of the substrate;
    forming a shielding layer over the encapsulant and substrate; and
    removing a portion of the shielding layer over a second portion of the surface of the substrate, wherein the second portion of the surface of the substrate includes a plurality of contact pads.

5. The method of claim 4, further including removing the portion of the shielding layer using laser ablation.

6. The method of claim 4, further including:
    disposing a mask over the second portion of the surface of the substrate; and
    removing the portion of the shielding layer by removing the mask.

7. The method of claim 4, further including disposing the substrate over a jig with a tab of the jig over the second portion of the surface of the substrate.

8. The method of claim 7, further including disposing an insulating layer on the tab of the jig and disposing the second portion of the surface of the substrate on the insulating layer.

9. A method of making a semiconductor device, comprising:
    providing a substrate;
    disposing a radio frequency (RF) electrical component over the substrate;
    depositing an encapsulant over a first portion of the substrate and the RF electrical component; and
    forming a shielding layer over the encapsulant, wherein a second portion of the substrate is exposed from the encapsulant and shielding layer.

10. The method of claim 9, wherein the substrate includes a contact pad disposed on the second portion of the substrate.

11. The method of claim 10, further including disposing a semiconductor package adjacent to the substrate outside the encapsulant, wherein the semiconductor package includes an interconnect structure connected to the contact pad.

12. The method of claim 10, wherein the contact pad is formed on a first surface of the substrate, and the encapsulant is deposited over the first surface of the substrate.

13. The method of claim 9, further including forming the shielding layer to cover a top surface and every side surface of the encapsulant.

* * * * *